(12) United States Patent
Stevenson et al.

(10) Patent No.: US 7,790,060 B2
(45) Date of Patent: *Sep. 7, 2010

(54) SIO$_x$:SI COMPOSITE MATERIAL COMPOSITIONS AND METHODS OF MAKING SAME

(75) Inventors: David E. Stevenson, Dexter, MI (US); Li Q. Zhou, Ann Arbor, MI (US)

(73) Assignee: Wintek Electro Optics Corporation, Ann Arbor, MI (US)

(*) Notice: Subject to any disclaimer, the term of this patent is extended or adjusted under 35 U.S.C. 154(b) by 1250 days.

This patent is subject to a terminal disclaimer.

(21) Appl. No.: 11/201,791

(22) Filed: Aug. 11, 2005

(65) Prior Publication Data

US 2007/0034837 A1 Feb. 15, 2007

(51) Int. Cl.
*C23C 14/34* (2006.01)
*H01B 1/16* (2006.01)
*B22F 5/00* (2006.01)
*B22F 3/15* (2006.01)

(52) U.S. Cl. ............. 252/500; 204/192.23; 204/298.12; 204/298.13; 428/403; 419/10; 419/19; 419/49

(58) Field of Classification Search ............ 204/298.18, 204/298.13; 252/500, 521.3; 501/53, 104, 501/154; 257/22; 438/667, 758; 423/335, 423/348
See application file for complete search history.

(56) References Cited

U.S. PATENT DOCUMENTS

| | | | |
|---|---|---|---|
| 3,849,344 A | 11/1974 | McMurtry et al | |
| 4,375,443 A | 3/1983 | Kipperman et al. | |
| 4,451,969 A | 6/1984 | Chaudhuri | |
| 4,859,553 A | 8/1989 | Jansen et al. | |
| 5,320,729 A | 6/1994 | Narizuka et al. | |
| 6,177,284 B1 | 1/2001 | Horii et al. | |
| 6,616,890 B2 | 9/2003 | McPhillips | |
| 6,730,934 B2 | 5/2004 | Yamada et al. | |
| 6,911,163 B2 | 6/2005 | Abe | |
| 7,037,581 B2 * | 5/2006 | Aramata et al. | 428/402 |
| 2002/0190048 A1 | 12/2002 | McPhillips | |
| 2003/0118905 A1 | 6/2003 | Fukuoka et al. | |
| 2004/0182700 A1 * | 9/2004 | Natsume et al. | 204/298.13 |
| 2007/0034500 A1 | 2/2007 | Stevenson et al. | |
| 2007/0034837 A1 | 2/2007 | Stevenson et al. | |
| 2007/0037404 A1 | 2/2007 | Stevenson et al. | |

FOREIGN PATENT DOCUMENTS

| | | |
|---|---|---|
| JP | 05-005177 | 7/1991 |
| JP | 04-028858 | 1/1992 |
| JP | 05-005117 A | 1/1993 |
| JP | 10-062776 | 3/1998 |
| JP | 2004-119615 | 4/2004 |
| JP | 2004-323324 | * 11/2004 |
| WO | WO 03/082769 A1 | * 10/2003 |

* cited by examiner

*Primary Examiner*—Stanley Silverman
*Assistant Examiner*—Kallambella Vijayakumar
(74) *Attorney, Agent, or Firm*—Robert L. Stearns; Dickinson Wright, PLLC

(57) ABSTRACT

Silicon oxide and electrically conductive doped silicon materials are sintered in a protective environment to yield a composite SiO$_x$:Si material that exhibits the properties of SiOx, and yet is electrically conductive due to the presence of Si. Such a composite material finds many uses, such as a target for DC and/or AC sputtering processes to produce silicon oxide thin films for touch-screen applications, barrier thin films in LCD displays and optical thin films used in a wide variety of applications.

18 Claims, 1 Drawing Sheet

SIO$_x$:SI COMPOSITE MATERIAL COMPOSITIONS AND METHODS OF MAKING SAME

BACKGROUND OF THE INVENTION

1. Technical Field

This invention relates to material compositions primarily composed of electrically non-conductive silicon oxide material in combination with fractions of materials that render the overall composition electrically conductive.

2. Related Art

One important commercial application for such material compositions is thin film technology. Many architectural, automotive, integrated circuit, flat panel display and optical devices require thin films of oxides of silicon (SiO$_x$), such as SiO$_2$.

One of the principal methods for producing such thin films is by a physical vapor deposition process known as radio frequency sputtering. This method utilizes non-conductive silicon dioxide material as the source material for the creation of the silicon dioxide thin film coatings. A high frequency ac-voltage, typically 13.56 MHz is applied capacitively to the target. In one phase, gas ions of the plasma are accelerated toward the target and cause material at the surface of the target to be detached as a result of the bombardment with the gas ions. In the other phase, the charge on the target surface is neutralized with the result that no sputtering occurs during this periodic phase. Although this method produces suitable silicon dioxide thin film coatings, it has the limitations of requiring the use of expensive and complex high frequency power supplies, low deposition rates for the formation of the SiO$_2$ thin film coatings, and inherent limitations on the uniformity of SiO$_2$ coatings that can be created with such method. Direct current (DC), pulsed DC or medium to low frequency alternating current (AC) sputtering processes do not have such limitations. However, DC and AC processes require the use of silicon as the source material for the SiO$_2$ coating. To utilize silicon as the deposition source material, it must be made sufficiently conductive either by doping with a suitable dopant such as boron, arsenic or by the addition of small amounts of aluminum or other suitable metals. To use such silicon targets to create SiO$_2$ thin films via DC or AC sputtering also requires that large amounts of oxygen be introduced into the sputtering process. The resultant process is referred to as reactive sputtering. The oxygen reacts with the silicon during the sputtering process to yield SiO$_2$. To create SiO$_2$ films typically requires that O$_2$ gas pressure be 30-50% of the total gas pressure in the vacuum chamber. This can result in a significant process mismatch in terms of the oxygen requirements, as compared to that required for other sputtered thin films which may be deposited using the same vacuum vessel. The presence of significant O$_2$ in the vacuum chamber also slows the deposition rate through collisions with the silicon. In addition, SiO$_2$ films made by DC and AC sputtering from silicon or Si:Al targets generally are not sufficiently dense and crystalline as a result of the characteristics of reactive deposition to render them suitable for many semi-conductor, flat panel and opto-electronics applications. The SiO$_2$ film compositions produced by such reactive processes generally exhibit less useful optical, mechanical and chemical durability properties compared to those produced by RF sputtering of non-conductive SiO$_2$ targets.

SUMMARY OF THE INVENTION

It is an object of the present invention to produce silicon oxide-based material compositions (with the general formula SiO$_x$) that include a sufficient amount of silicon to render the composition electrically conductive. The SiO$_x$:Si material compositions of this invention are suitable for any application calling for electrically conductive SiO$_x$-based material. One such use is as a target material for use in DC (including DC-pulsed) or AC sputtering processes to produce high quality SiOx thin film coatings with the addition of only small amounts of O$_2$ during the deposition process, since the presence of SiO$_x$ in the target material serves as a source of oxygen in the vessel thereby decreasing the amount of oxygen gas that typically needs to be fed into the vessel during reactive sputtering DC or AC processes. This enables the production efficiencies of DC and AC sputtering to be used to produce SiO$_x$ coatings with properties that can be equivalent to those produced by the less efficient and more costly RF sputtering method.

The SiO$_x$:Si material of the invention is composed of the constituent materials of electrically non-conductive SiO$_x$ and an amount of Si that has been doped and combined with the SiO$_x$ in a manner that physically unites the materials to render the overall SiO$_x$-based composition electrically conductive. In some embodiments, there can be the addition of one or more metals in amounts smaller than that of the Si component. These material compositions, although primarily composed of insulating silicon dioxide, exhibit good electrical conductivity while retaining many of the other intrinsic material properties of the silicon oxide. Such materials can be fabricated in solid bulk forms such as plates, rods and tubes. In addition these bulk materials can be reduced (or reground) to powder form with such powders retaining the electrically conductive properties of the bulk material for use alone or with other materials in the formation of various articles of manufacture.

Accordingly, it is an object of the present invention to produce a composite SiO$_x$:Si material which, although primarily composed of insulating SiO$_x$ material, has good electrical conductivity due to the presence of the Si material. This material may find use in many applications that require the optical, thermal, mechanical, or chemical properties of SiO$_x$ but which also require electrical conductivity to be useful. The electronic properties of this material can be adjusted based on the ratio of the constituents of electrically conductive doped Si, SiO$_x$ and in some embodiments small fractions of various metals.

According to a further aspect, particles of this conductive Si:SiO$_x$ material may be mixed or added to other materials to provide or enhance electrical conductivity or other useful properties.

BRIEF DESCRIPTION OF THE DRAWINGS

These and other features and advantages of the present invention will become more readily appreciated when considered in connection with the following detailed description and appended drawings, wherein.

DETAILED DESCRIPTION OF THE PREFERRED EMBODIMENT

Figure 1:
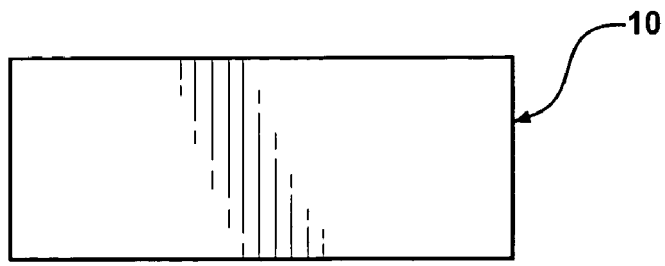
FIG. 1 is a schematic illustration of an article made of the Si:SiO$_x$ material.

The present invention is directed to the formation of composite silicon oxide:silicon (SiO$_x$:Si) material that is rendered conductive by the selection of starting materials and the process by which they are combined to form the composite.

According to the fundamental principals of the present invention, the process starts out with a silicon oxide, $SiO_x$ powder (e.g., $SiO_2$ powder) which is substantially electrically non-conductive. The $SiO_x$ powder is united with electrically conductive Si material in a manner that protects the Si against substantial oxidation during the process and which renders the overall composite electrically conductive while preserving the characteristics of each of the $SiO_x$ and Si materials.

One approach contemplated by the invention starts out with a blend of $SiO_2$ and conductive Si powders. The blended powder is compacted and sintered to form an article that has the properties of being similar to silicon oxide but with low resistivity, and thus they find use in many applications. For example, one particular usage for such a material is as a sputtering target suitable use in a DC or AC thin film sputtering process.

According to this first presently preferred embodiment of the invention, the conductive silicon component of the powder blend is prepared by crushing and then grinding doped silicon (such as boron p-type doped silicon) into a powder. As is well known to those skilled in the art, the doping of the silicon material may be achieved by adding a suitable n or p dopant to molten silicon prior to growing or casting the amorphous single or poly phase crystal of the silicon. The concentration and uniformity of these dopant atoms determine the specific electrical characteristics of the silicon.

The invention contemplates that various approaches can be employed to blend the particles of silicon oxide and conductive silicon and that variations can occur in the size of the particles and the ratio of the silicon oxide to doped silicon particles in order to alter the electrical conductive properties or resistivity of the end product. In the first presently preferred embodiment, the composition of the base silicon oxide powder is greater than 50% by weight, and that of the conductive silicon powder is greater than 10% by weight, with the silicon oxide preferably making up the majority of the powder blend. According one presently preferred process, the powders may be blended together in a pot using zirconia balls as milling media until the average particle size of the blended powder is reduced to less than 5 μm. Once the powder has been sufficiently blended, it is preferably placed in a metal containment unit and then heated under vacuum conditions to eliminate residual moisture. Following heating to drive off the moisture, the containment unit is evacuated and sealed and then placed in a hot isostatic chamber and then heated to a temperature and pressure sufficient to densify and sinter the silicon oxide and doped silicon particles. For this purpose, the container is preferably one which can withstand the heat and pressure of the hot isostatic-pressing environment, but which flows plastically under the heat and pressure so as to consolidate and densify the powder material within the container. Once densified, the resultant article of silicon oxide-doped silicon material is removed from the container. The resulting composition is preferably densified to at least 90% of theoretical density, and preferably at least 95% of full theoretical density, and still more preferably greater than 99% of full theoretical density. According to a preferred process, the powder is subjected to hot isostatic pressure (HIP) at temperatures of between 1200 to 1450° C. and under pressures exceeding 20 kpsi. More particularly, the preferred process involves hot isostatic press heating to 1000° C. under vacuum conditions and then gradually applying the pressure to more than 20 kpsi while increasing the temperature to between 1200 to 1350° C. According to a further feature of the invention, the resultant sintered article 10 has a resistivity value of less than 200Ω·cm. Preferably, the article or target has resistivity less than 150Ω·cm and still more preferably below 20Ω·cm and still further more preferably at or below 10Ω·cm. Accordingly, the range of resistivity contemplated by the invention is in the range of about 10Ω·cm or less to about 200Ω·cm.

Figure 2:
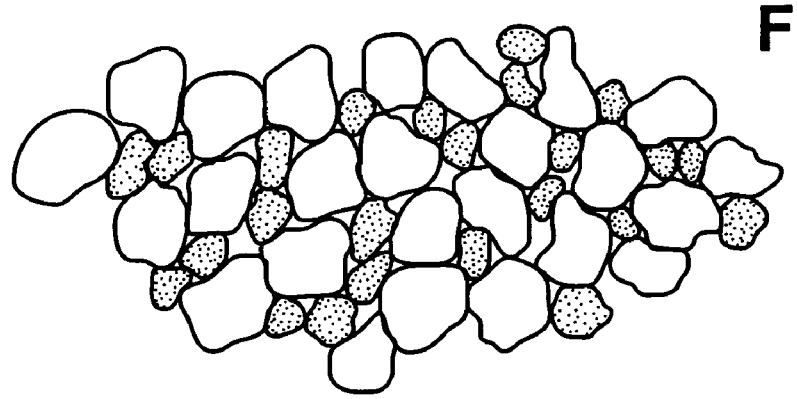
FIG. 2 is a schematic illustration showing further details of the material.

FIG. 1 schematically illustrates an article 10 made of the inventive material. FIG. 2 schematically illustrates details of the material structure in which the non-conductive silicon oxide is present in a web of electrically conductive silicon. The conductive silicon serves as a conductive web that renders the overall material conductive.

Figure 3:
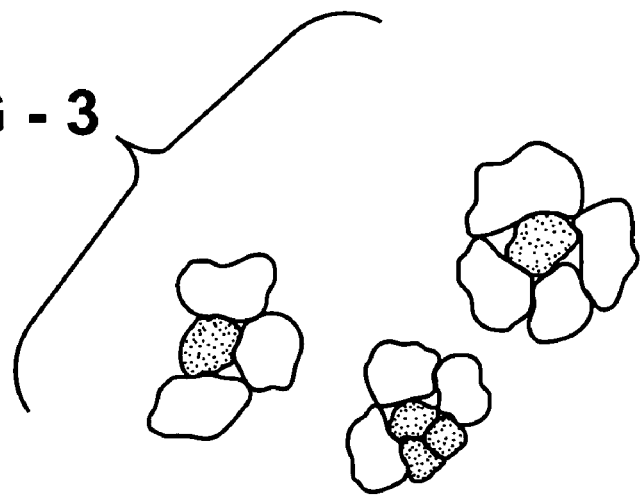
FIG. 3 is version of the material in particulate form.

FIG. 3 shows a version of the material in particulate form. This material can be prepared by regrinding the sintered $SiO_x$:Si material resulting from the process described above, or may be formed directly in particulate form by a process in which $SiO_x$ particles are coated with molten electrically conductive Si in a protective non-oxidizing atmosphere such as argon to cause the Si to at least partially coat and unite with the $SiO_x$ particles, while protecting the molten Si against oxidation in the process. The resultant composite particles can be mixed with other such particles and/or blended with an amount of uncoated silicon oxide particles and thereafter sintered to form an article. The amount of the conductive composite particles will be that amount which is needed to achieve the desired electrical conductivity properties. For example, the invention contemplates that enough of the composite particles are present to provide a conductive path through the bulk of the sintered material.

Once the article is prepared, it can be used in a number of different applications, such as a target in a direct current (DC) or low to medium frequency alternating (AC) sputtering process for producing silicon oxide coatings.

The invention contemplates that various manufacturing methods can be used to prepare the material that yield the same desirable characteristics and properties described above. These alternative methods can be used with or without the hot isostatic pressing. Such additional processes include vacuum plasma spraying of the Si material onto the $SiO_x$ material in an inert gas atmosphere to preclude oxidizing the Si; vacuum casting ("melt casting") of the materials to connect Si grains of the blend in the presence of the $SiO_x$ grains to yield a conductive network; vacuum hot pressing of the materials in an inert gas atmosphere; and inert gas microwave melting and solidification.

The invention also contemplates various post-treatment methods for rendering the Si conductive in the company of $SiO_2$. In this case the Si is alone in powder form or united with the $SiO_x$ in reground powder form, with the Si initially being non-conductive. One alternative approach for making the silicon conductive is by means of thermal gas diffusion in non-oxygen atmosphere using a gas such as Arsine, $AsH_3$ composition. Another approach is ion implantation with dopants such as Boron. It is also contemplated that the dopant such as Arsenic, Gallium, or Phosphorous could be added in powder form to reground non-conductive Si:$SiO_x$ powder and then sintered in a non-oxygen atmosphere. Still another approach to post-treatment doping of initially non-conductive Si is to mix metal powder such as Al, Mg, Sn, In, Mn, Zn, Bi, Cd, Se, and/or Ga with reground non-conductive Si:$SiO_x$ powder and then sinter in a non-oxygen atmosphere.

Obviously, many modifications and variations of the present invention are possible in light of the above teachings. It is, therefore, to be understood that within the scope of the appended claims, the invention may be practiced otherwise than as specifically described. The invention is defined by the claims.

What is claimed is:

1. A composite $SiO_x$-based material, comprising:
regions of $SiO_x$ material joined with discrete regions of conductive doped Si material, wherein the $SiO_x$ material is present in an amount between about 50% to about 80% by weight of the composite, wherein SiOx consists of $SiO_2$ and the $SiO_2$ and Si materials are each in particulate form.

2. The material of claim 1 wherein the composite material is admixed with another particulate material.

3. The material of claim 1 wherein at least some the $SiO_x$ particles of the composite are substantially coated with the electrically conductive Si material.

4. The material of claim 1 wherein the composite material is sintered.

5. The material of claim 4 wherein the sintered composite material has a resistivity of about 200·Ω cm or less.

6. The material of claim 4 wherein the sintered composite material has a resistivity of about 20·Ω cm or less.

7. The material of claim 4 wherein the sintered composite material has a resistivity of about 10 Ω·cm or less.

8. The material of claim 4 wherein the sintered composite is compacted to at least 90% of full theoretical density.

9. A method of making conductive $SiO_x$-based composite material, comprising:
preparing $SiO_x$ powder; and
joining conductive Si material to the $SiO_x$ material, to form a composite $SiO_x$—Si material that is particulate in form, and wherein the $SiO_x$ powder consists of $SiO_2$.

10. The method of claim 9 wherein the conductive Si is applied in one of liquid, gas or semi-solid form to the $SiO_x$ particles.

11. The method of claim 9 wherein the step of joining the Si material to the $SiO_x$ material is carried out in a non-oxidizing environment so as to protect the Si from oxidizing in the process.

12. The method of claim 9 wherein the $SiO_x$ powder is present in an amount between about 50% to about 80% by weight of the composite.

13. The method of claim 9 wherein prior to joining, the Si material is prepared first in powder form and blended with the $SiO_x$ powder and thereafter compacted and sintered in a non-oxidizing environment.

14. The method of claim 13 wherein the compacted and sintered composite material is formed with a density of at least 90% of full theoretical density.

15. The method of claim 9 wherein the composite material is formed with a resistivity of about 200 Ω·cm or less.

16. The method of claim 9 wherein the composite material is formed with a resistivity of about 20 Ω··cm or less.

17. The method of claim 9 wherein the composite material is formed with a resistivity of about 10 Ω·cm or less.

18. A method of making conductive $SiO_x$-based composite material, comprising:
preparing $SiO_x$ powder; and
joining Si material to the $SiO_x$ powder and doping the Si material to render it conductive, wherein the $SiO_x$ powder consists of $SiO_2$, and the joined $SiO_2$ and Si material is in particulate form.

* * * * *